United States Patent [19]
Jeng et al.

[11] Patent Number: 6,133,067
[45] Date of Patent: Oct. 17, 2000

[54] ARCHITECTURE FOR DUAL-CHIP INTEGRATED CIRCUIT PACKAGE AND METHOD OF MANUFACTURING THE SAME

[75] Inventors: Jacob Jeng, Hsinchu; Kun-Luh Chen, Chu-Nan; Edward Chen, Hsinchu, all of Taiwan

[73] Assignee: Amic Technology Inc., Hsinchu, Taiwan

[21] Appl. No.: 09/048,467

[22] Filed: Mar. 26, 1998

[30] Foreign Application Priority Data

Dec. 6, 1997 [TW] Taiwan ................................. 86118374

[51] Int. Cl.[7] ........................... H01L 21/44; H01L 21/48; H01L 21/50
[52] U.S. Cl. ........................... 438/110; 438/111; 438/112; 438/127
[58] Field of Search .................... 438/110, 111, 438/112, 127

[56] References Cited

U.S. PATENT DOCUMENTS

| | | | |
|---|---|---|---|
| 5,034,350 | 7/1991 | Marchisi | 437/207 |
| 5,366,933 | 11/1994 | Golwalkar et al. | 437/215 |
| 5,646,829 | 7/1997 | Sota | 36/813 |
| 5,733,802 | 3/1998 | Inoue et al. | 438/127 |
| 5,898,220 | 4/1999 | Ball | 257/723 |

*Primary Examiner*—John F. Niebling
*Assistant Examiner*—Alexander G. Ghyka
*Attorney, Agent, or Firm*—Knobbe, Martens, Olson & Bear, LLP

[57] ABSTRACT

An architecture for a dual-chip IC package and a method of manufacturing the same are provided. The dual-chip IC package allows two chips to be mounted on the same leadframe in the same package. The two chips can be either the same type of a semiconductor device or two different types of semiconductor devices with different functions such as a memory chip and a logic control chip. The architecture allows a simplified manufacturing process and an increased good yield rate for the two IC chips that are to be enclosed in the dual-chip IC package. Moreover, the dual-chip IC package can be manufactured with existing packaging equipment and processes, so that it can be realized without having to invest on and install additional ones.

18 Claims, 4 Drawing Sheets

ARCHITECTURE FOR DUAL-CHIP INTEGRATED CIRCUIT PACKAGE AND METHOD OF MANUFACTURING THE SAME

CROSS-REFERENCE TO RELATED APPLICATION

This application claims the priority benefit of Taiwan application serial no. 86118374, filed Dec. 6, 1997, the full disclosure of which is incorporated herein by reference.

BACKGROUND OF THE INVENTION

1. Field of the Invention

This invention relates to integrated circuit (IC) manufacture technologies, and more particularly, to the architecture of a dual-chip IC package and a method of manufacturing the same, which can allow two chips to be mounted on the same leadframe in the same package for the provision of expanded functionality from one single IC package.

2. Description of Related Art

Integrated circuits are widely used in computers and intelligent electronic devices. Since IC chips are very small in size, they are usually supplied in packages for easy handling and utilization. The manufacture of ICs involves very complicated processes which can involve several hundreds of steps and needs several months to complete. The semiconductor industry is composed of four major branches: IC design, wafer fabrication, wafer testing, and packaging, each being a highly specialized field which requires stateof-the-art technologies and large amounts of capitals to accomplish.

The manufacture of an IC package includes three essential steps: preparing a wafer, forming a predesigned circuit on the wafer, and finally packing each die (chip) cutting apart from the wafer in a package. The packaging process is the final stage in the IC manufacture.

Conventional packaging methods, however, only allow the packing of one single chip in each package. In the case where it is desirable to provide various functions, such as memory and control logic, in the same IC package, these two functions must be formed in the same chip and then packed in a single-chip IC package in accordance with the conventional method. However, since the memory unit and the logic control unit, when implemented in integrated circuits, are different in layout specifications, such as line width, which would make the fabrication for such chips involve very complicated processes to achieve, resulting in a high manufacturing cost and low good yield rate.

FIGS. 1A–1C are schematic sectional diagrams used to depict the architecture of a conventional single-chip IC package and the steps involved in the method for manufacturing this 1C package.

Referring first to FIG. 1A, the 1C package is to be constructed on a leadframe 10 which is formed with two major parts: a die pad 13 in the center and a number of package pins 14 on the periphery of the die pad 13. In the packaging process, the first step is to perform a die-attach process so as to mount a chip 11 (which is a die cut apart from a fabricated wafer) on the front side of the die pad 13.

Referring next to FIG. 1B, in the subsequent step, a wire-bonding process is performed so as to connect the bonding pads (not shown) on the chip 11 respectively via a plurality of wires 15 to the corresponding ones of the package pins 14.

Referring further to FIG. 1C, in the subsequent step, a molding process is performed so as to form a molded compound 17 which hermetically encloses the chip 11, the die pad 13, and the wires 15 therein, with only the outer end of the package pins 14 being exposed to the outside.

The foregoing is a single-chip IC package which can enclose only one single chip therein. In the case where it is desirable to provide various functions from the same IC package, these functions must be formed in the same chip and then packaged in accordance with the method described above. However, as mentioned earlier, this would involve very complicated processes to achieve, resulting in a high manufacturing cost and low good yield rate.

SUMMARY OF THE INVENTION

It is therefore an objective of the present invention to provide an architecture for a dual-chip IC package and a method of manufacturing the same, which can allow two chips to be packed in the same IC package so that more functions can be integrated in one single IC package.

In accordance with the foregoing and other objectives of the present invention, a new architecture for a dual-chip IC package and a method of manufacturing the same are provided. Two preferred embodiments of the invention are disclosed.

The first preferred embodiment of the architecture of the dual-chip IC package includes the following constituent elements: a leadframe which includes a die pad and a number of package pins; a first chip mounted on a first side of said die pad; a plurality of first wires which electrically connect the first chip to a first selected set of the package pins; a second chip mounted on a second side of the die pad; a plurality of second wires which electrically connect the second chip to a second selected set of the package pins; and a molded compound which covers the packaging areas on both sides of said leadframe to thereby enclose the first chip and the second chip therein. In accordance with the invention, a method is provided for manufacturing a dual-chip IC package based on the foregoing architecture.

The second preferred embodiment of the architecture of the dual-chip IC package includes the following constituent elements: a leadframe which includes a die pad and a number of package pins; a first chip mounted on a first side of said die pad; a plurality of first wires which electrically connect the first chip to a first selected set of the package pins; a molded compound formed through a molding process to enclose the first chip therein; a second chip mounted on a second side of the die pad; a plurality of second wires which electrically connect the second chip to a second selected set of the package pins; and a dispensed compound formed through a dispensing process to enclose the second chip therein. In accordance with the invention, a method is provided for manufacturing a dual-chip IC package based on the foregoing architecture.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
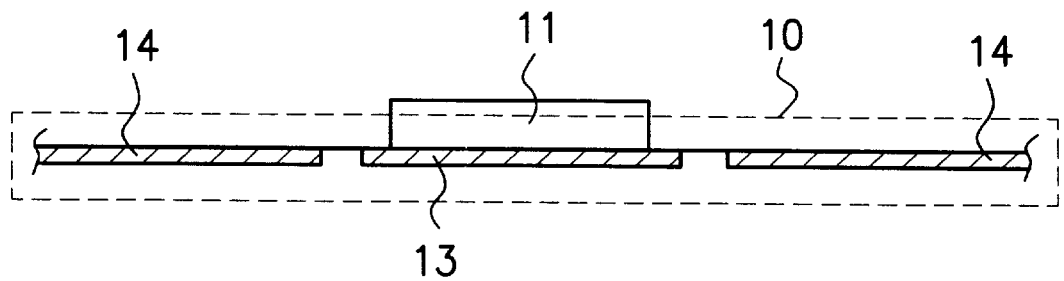
FIGS. 1A–1C are schematic sectional diagrams used to depict the architecture of a conventional IC package and the steps involved in the conventional method for manufacturing this IC package.
Figure 1B:
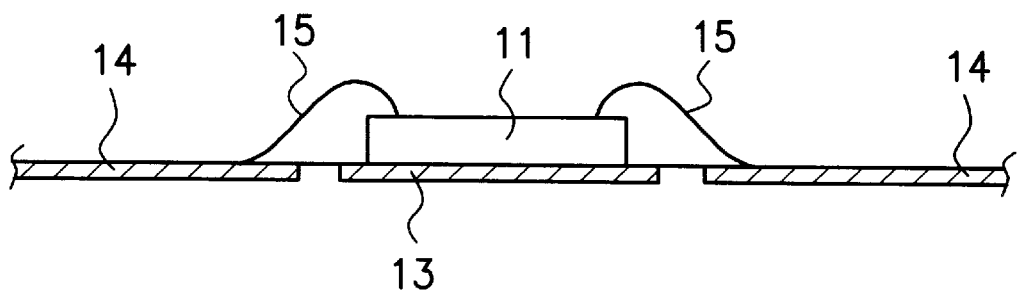
Figure 1C:
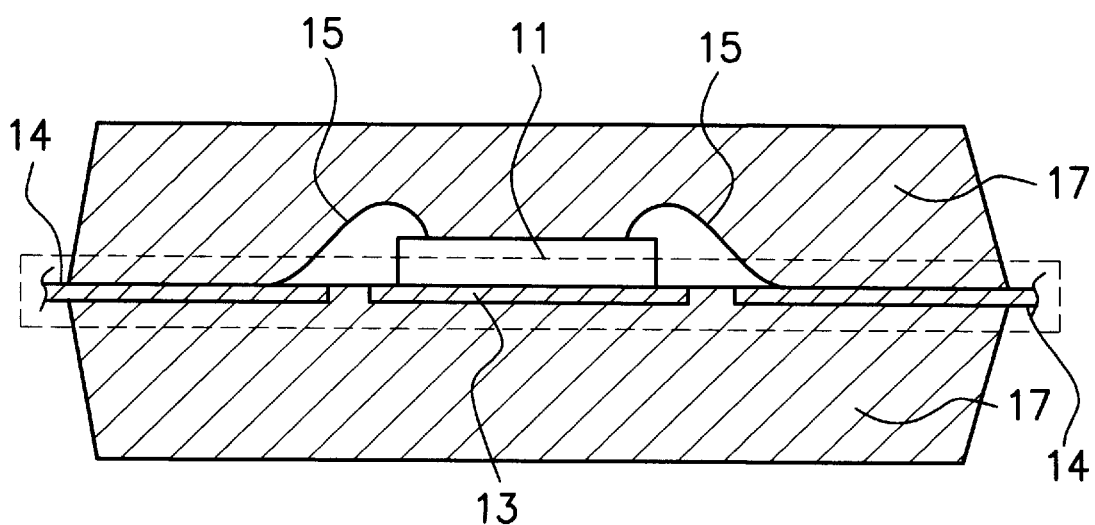

In accordance with the invention, two preferred embodiments are disclosed in the following with reference to FIGS. 2A–2E and FIGS. 3A–3F respectively. In these drawings, identical elements are labeled with the same reference numerals as those shown in FIGS. 1A–1C.

First Preferred Embodiment

FIGS. 2A–2E are schematic sectional diagrams used to depict a first preferred embodiment of the architecture of the dual-chip IC package according to the invention and the method for manufacturing the same.

Figure 2A:
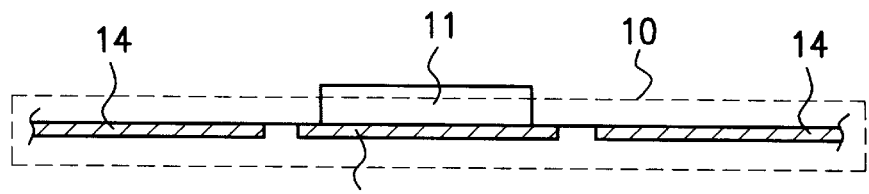
FIGS. 2A–2E are schematic sectional diagrams used to depict a first preferred embodiment of the architecture of the dual-chip IC package according to the invention and the method for manufacturing the same.

Referring first to FIG. 2A, the dual-chip IC package is to be constructed on a leadframe 10 which is formed with two major parts: a die pad 13 in the center and a number of package pins 14 on the periphery of the die pad 13.

In the packaging process, the first step is to perform a first die-attach process so as to mount a first chip 11 (which is a die cut apart from a fabricated wafer) on the front side of the die pad 13.

Figure 2B:
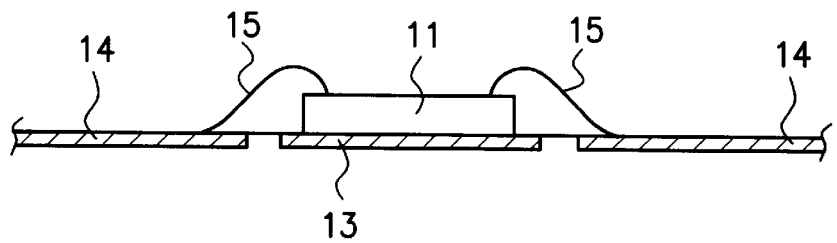

Referring next to FIG. 2B, in the subsequent step, a first wire-bonding process is performed so as to connect the bonding pads (not shown) on the first chip 11 respectively via a plurality of first wires 15 to a first selected set of the package pins 14.

Figure 2C:
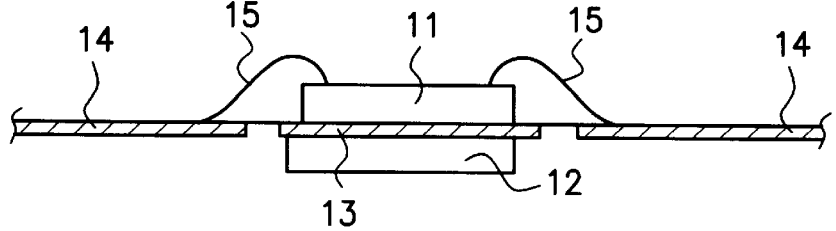

Referring further to FIG. 2C, the next step is to perform a second die-attach process so as to mount a second chip 12 (which is another die cut apart from a fabricated wafer which can be the same wafer where the first chip 11 is cut apart, or another wafer with a different circuit function) on the back side of the die pad 13.

Figure 2D:
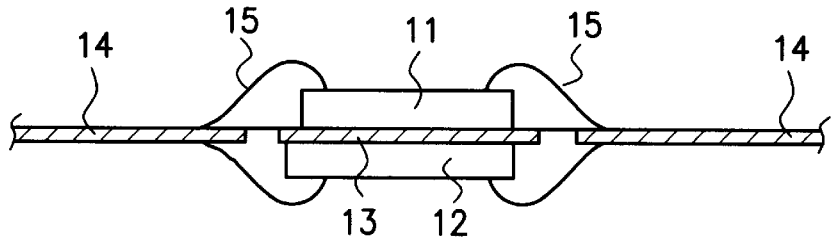

Referring next to FIG. 2D, in the subsequent step, a second wire-bonding process is performed so as to connect the bonding pads (not shown) on the second chip 12 respectively via a plurality of second wires 16 to a second selected set of the package pins 14.

Figure 2E:
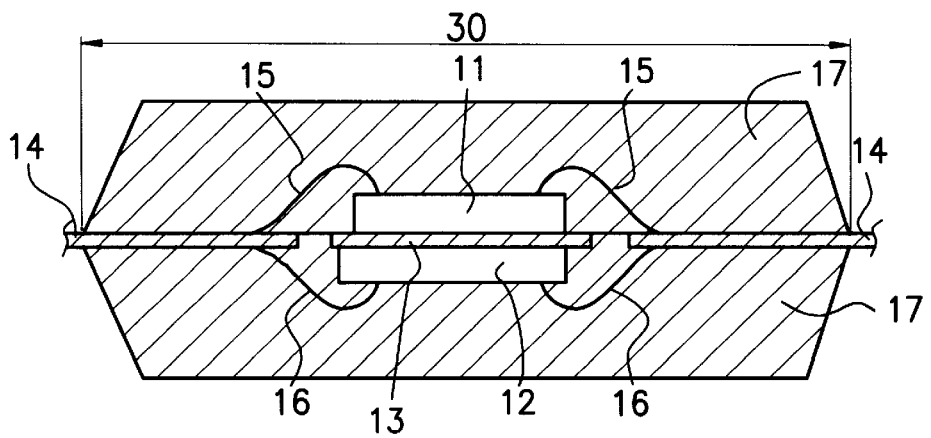

Referring further to FIG. 2E, in the subsequent step, a molding process is performed so as to form a molded compound 17 which hermetically encloses a predefined area on the leadframe 10 (referred to as packaging area and designated by the reference numeral 30, which includes the first chip 11, the second chip 12, the die pad 13, the first and second wires 15, 16 therein), with only the outer end of the package pins 14 being exposed to the outside. This completes the manufacture of the dual-chip IC package of the invention.

In conclusion, the architecture of the foregoing dual-chip IC package of the invention includes two chips 11, 12 mounted respectively on the front and back sides of the die pad 13, which are then respectively connected via first and second wires 15, 16 to the package pins 14 and enclosed in the molded compound 17. It is an apparent advantage of the invention over the prior art that one single package can be used to contain two chips therein.

Second Preferred Embodiment

FIGS. 3A–3F are schematic sectional diagrams used to depict a second preferred embodiment of the architecture of the dual-chip IC package according to the invention and the method for manufacturing the same. In these drawings, those identical elements as in the dual-chip IC package of FIGS. 2A–2E are labeled with the same reference numerals.

Figure 3A:
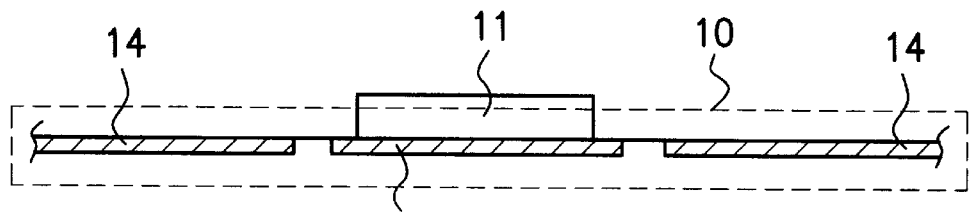
FIGS. 3A–3F are schematic sectional diagrams used to depict a second preferred embodiment of the architecture of the dual-chip IC package according to the invention and the method for manufacturing the same.

Referring first to FIG. 3A, the dual-chip IC package is to be constructed on a leadframe 10 which is formed with two major parts: a die pad 13 in the center and a number of package pins 14 on the periphery of the die pad 13. In the packaging process, the first step is to perform a first die-attach process so as to mount a first chip 11 (which is a die cut apart from a fabricated wafer) on the front side of the die pad 13.

Figure 3B:
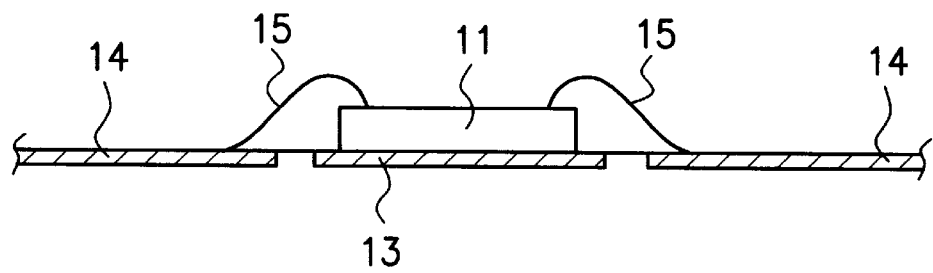

Referring next to FIG. 3B, in the subsequent step, a first wire-bonding process is performed so as to connect the bonding pads (not shown) on the first chip 11 respectively via a plurality of first wires 15 to a first selected set of the package pins 14.

Figure 3C:
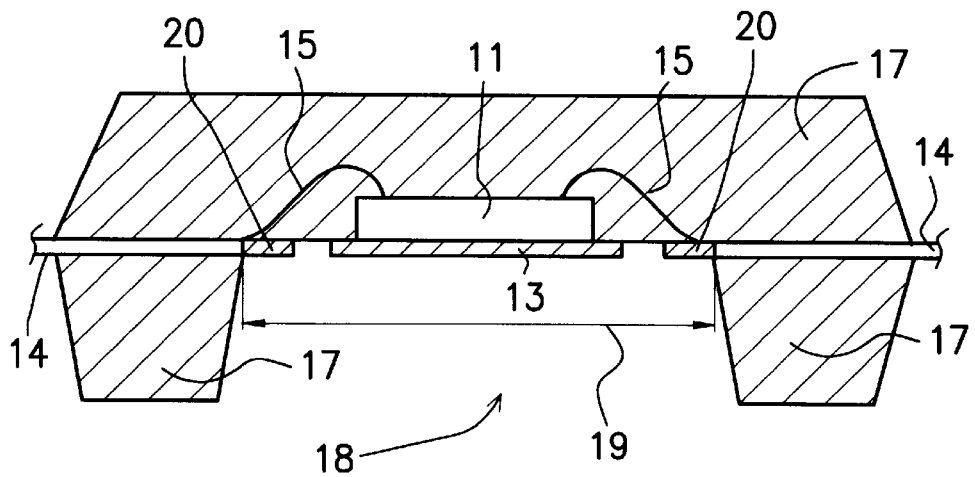

Referring further to FIG. 3C, a first molding process is performed so as to form a molded compound 17 which covers all the packaging area on the front side of the leadframe 10 where the first chip 11 is mounted, but covers only a peripheral area on the back side of the leadframe 10 with a window 18 which exposes the bonding area 19 on the back side of the leadframe 10 including the die pad 13 and the area where the bonding lead tips 20 connected to the package pins 14 are formed.

Figure 3D:
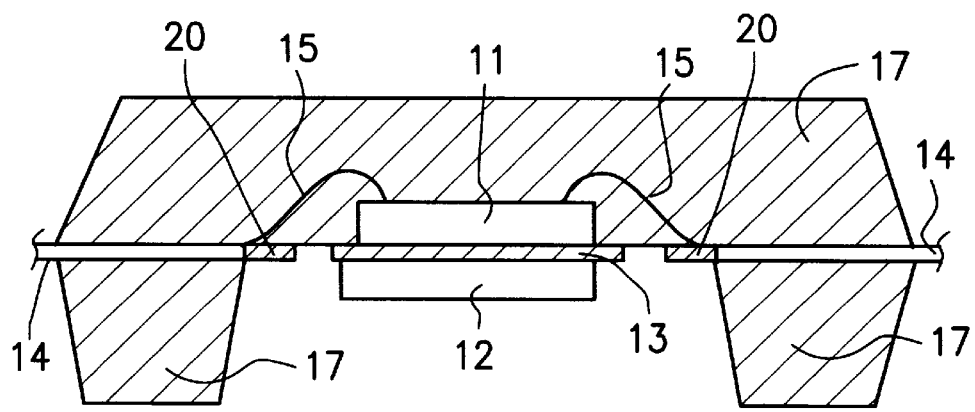

Referring further to FIG. 3D, the next step is to perform a second die-attach process so as to mount a second chip 12 (which is another die cut apart from a fabricated wafer which can be the same wafer where the first chip 11 is cut apart, or another wafer with a different circuit function) through the window 18 on the back side of the die pad 13.

Figure 3E:
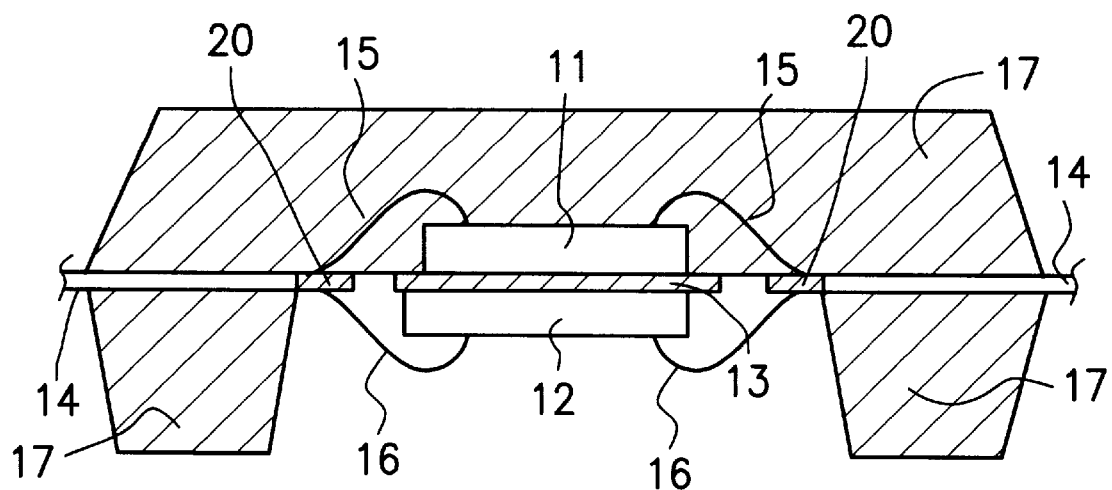

Referring next to FIG. 3E, in the subsequent step, a second wire-bonding process is performed so as to connect the bonding pads (not shown) on the second chip 12 respectively via a plurality of second wires 16 to the corresponding bonding lead tips 20 which are connected to a second selected set of the package pins 14.

Figure 3F:
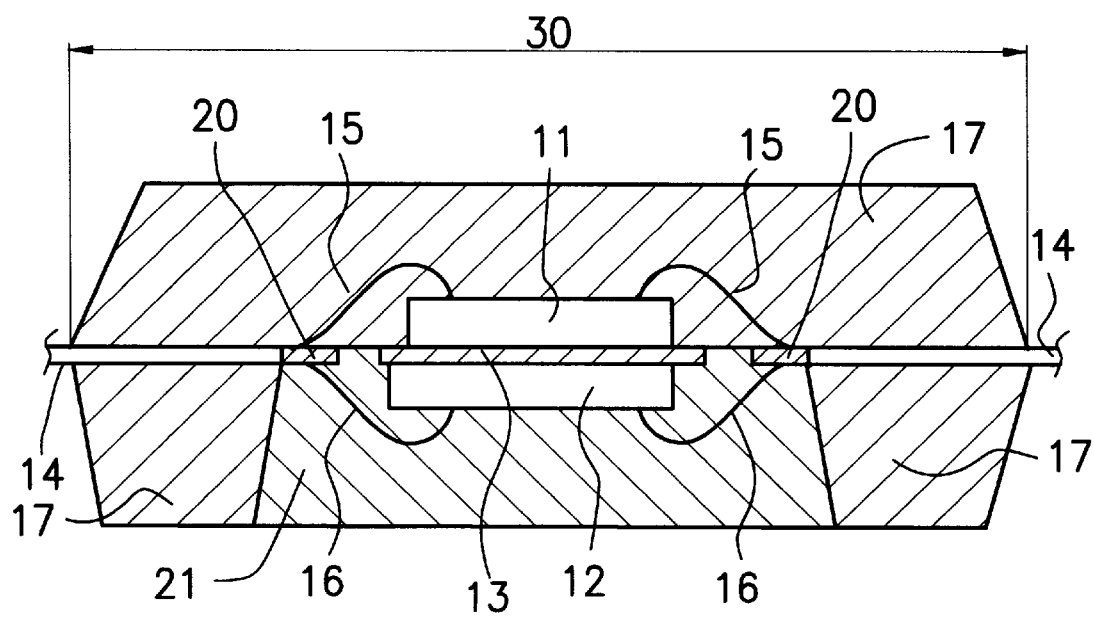

Referring further to FIG. 3F, in the subsequent step, a dispensing process is performed so as to fill a dispensing material into the window 18 to thereby form a dispensed compound 21 on the back side of the leadframe 10. The dispensed compound 21 hermetically encloses the bonding area 19, including the second chip 12, therein.

In conclusion, the architecture of the foregoing dual-chip IC package of the invention includes two chips 11, 12 mounted respectively on the front and back sides of the die pad 13, which are then respectively connected via first and second wires 15, 16 to the bonding lead tips 20 which are connected to corresponding package pins 14. This embodiment differs from the previous one particularly in that two compounds, i.e., the molded compound 17 and the dispensed compound 21 are used respectively to enclose the first chip 11 and second chip 12 therein.

The dispensed compound 21 can be formed from a colored material for identification purpose of the integrated circuit. For instance, the dispensing material can be selected from a colored resin or plastic material, such that the dispensed compound 21 Is different in color from the molded compound 17 for a certain prespecified identification purpose. Since the dispensed compound 21 and the molded compound 17 are formed through separate processes, they can be formed either from the same material or from two different materials respectively. Moreover, in accordance with actual requirements, the surface of the dispensed compound 21 can be either designed to be leveled with or higher or lower in surface than the surrounding part of the molded compound 17 formed on the back side of the leadframe.

With the invention, for example, a memory chip and a control logic chip can be formed on separate wafers, then cut apart from the respective wafers to be mounted together on the same leadframe in the same IC package in accordance with the architecture and method disclosed above. Since the two chips are formed separately, the fabrications thereof would involve considerably simplified processes, which would not only be easy to perform, but also can allow reduced manufacturing cost and increased good yield rate for the fabricated chips.

Moreover, the invention allows good symmetry in the package architecture, which would allow increased good yield rate for the manufactured IC packages.

Still moreover, the method of the invention can be realized by using existing packaging equipment and processes without having to invest on and install new additional ones. It is also suitable for use on various existing types of IC packages with any numbers of pins. The invention can thus be realized in a very cost-effective manner.

The two chips enclosed in the dual-chip IC package can be either the same type of semiconductor device, such as a memory device, so that the storage capacity can be doubled in one single IC package, or two different types of semiconductor devices, such as a memory device and a logic control device, so that the functionality of one single IC package can be expanded. The two chips are functionally connected via a plurality of internal wires. If the two chips share a common voltage or ground pin, the associated bonding pads on the two chips can be wired together to the same voltage pin or ground pin.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for manufacturing a dual-chip IC package, comprising the steps of:
    (1) preparing a leadframe which includes a die pad and a number of package pins;
    (2) performing a first die-attach process so as to mount a first chip on a first side of the die pad;
    (3) performing a first wire-bonding process so as to electrically connect the first chip to a first selected set of the package pins;
    (4) performing a second die-attach process so as to mount a second chip on a second side of the die pad;
    (5) performing a second wire-bonding process so as to electrically connect the second chip to a second selected set of the package pins;
    (6) performing a molding process so as to form a molded compound to simultaneously enclose the first chip and the second chip therein.

2. The method of claim 1, wherein the first chip and the second chip are formed with different types of semiconductor devices respectively.

3. The method of claim 1, wherein the first chip and the second chip are formed with the same type of a semiconductor device.

4. A method for manufacturing a dual-chip IC package, comprising the steps of:
    (1) preparing a leadframe which includes a die pad and a number of package pins;
    (2) performing a first die-attach process so as to mount a first chip on a first side of the die pad;
    (3) performing a first wire-bonding process so as to electrically connect the first chip to a first selected set of the package pins;
    (4) performing a molding process with a molding material so as to form a molded compound which covers the entire packaging area on the first side of the leadframe to enclose the first chip therein, but only a peripheral part of the packaging area on the second side of the leadframe with a window to expose the bonding area on the second side of the leadframe;
    (5) performing a second die-attach process so as to mount a second chip through the window on the second side of the die pad;
    (6) performing a second wire-bonding process so as to electrically connect the second chip to a second selected set of the package pins; and
    (7) performing a dispensing process with a dispensing material so as to form a dispensed compound in the window to enclose the second chip therein.

5. The method of claim 4, wherein the bonding area includes the die pad therewithin, in which the first chip and the second chip are mounted.

6. The method of claim 4, wherein the bonding area includes a plurality of bonding lead tips therewithin which are wired to corresponding bonding pads on the second chip.

7. The method of claim 4, wherein the first chip and the second chip are formed with different types of semiconductor devices respectively.

8. The method of claim 4, wherein the first chip and the second chip are formed with the same type of a semiconductor device.

9. The method of claim 4, wherein the molding material and the dispensing material are two different materials.

10. The method of claim 4, wherein the molding material and the dispensing material are one same material.

11. The method of claim 4, wherein the molding material includes plastics.

12. The method of claim 4, wherein the molding material includes resin.

13. The method of claim 4, wherein the dispensing material includes colored resin.

14. The method of claim 4, wherein the dispensing material includes resin.

15. The method of claim 4, wherein the dispensing material includes plastics.

16. The method of claim 4, wherein the dispensed compound is protruded with respect to the surrounding part of the molded compound on the second side of the leadframe.

17. The method of claim 4, wherein the dispensed compound is leveled with the surrounding part of the molded compound on the second side of the leadframe.

18. The method of claim 4, wherein the dispensed compound is recessed with respect to the surrounding part of the molded compound on the second side of the leadframe.

* * * * *